United States Patent [19]

Cressey et al.

[11] Patent Number: 4,573,175
[45] Date of Patent: Feb. 25, 1986

[54] VARIABLE DIGITAL FREQUENCY GENERATOR WITH VALUE STORAGE

[75] Inventors: John R. Cressey, College Pk.; Stephen A. Miller, Baltimore, both of Md.

[73] Assignee: Case Communications Inc., Silver Spring, Md.

[21] Appl. No.: 531,328

[22] Filed: Sep. 12, 1983

[51] Int. Cl.⁴ .............................................. H03B 3/72
[52] U.S. Cl. .................................... 377/44; 377/50; 377/43; 307/271
[58] Field of Search .................. 331/25; 328/155; 377/44, 50, 47, 43; 307/271

[56] References Cited

U.S. PATENT DOCUMENTS

| | | |
|---|---|---|
| 3,096,483 | 7/1963 | Ransom . |
| 3,651,414 | 3/1972 | Jamieson . |
| 3,845,281 | 10/1974 | Kunisi et al. ........................... 377/50 |
| 3,976,945 | 8/1976 | Cox ...................................... 328/155 |
| 4,007,408 | 2/1977 | Berney . |
| 4,101,838 | 7/1978 | Aihara et al. .......................... 377/50 |
| 4,360,788 | 11/1982 | Erps et al. .............................. 331/25 |

Primary Examiner—John S. Heyman
Attorney, Agent, or Firm—Saidman, Sterne, Kessler & Goldstein

[57] ABSTRACT

Characteristics of a pulse sequence, such as frequency, are controlled in a simple circuit without requirement for specific storage components. The cumulative effect of a sequence of control signals is maintained by providing a phase shift between a pair of waveforms. The phase shift between the waveforms is used to provide a number of control pulses to the circuit for varying the desired characteristic. In a particular embodiment, control signals are externally provided for varying the phase shift between two waveforms. In response to the phase variation, a number of control signals are provided for adding or deleting pulses to a pulse stream. The use of feedback control loops results in repeated addition and/or deletion of pulses to or from the pulse stream, thereby varying the output frequency in accordance with a one time input of the external control signals. In accordance with the principles of the invention, serial or parallel control signals may be provided, and ripple counters (or a combination of ripple and presettable counters) may be used for the frequency control function.

14 Claims, 20 Drawing Figures

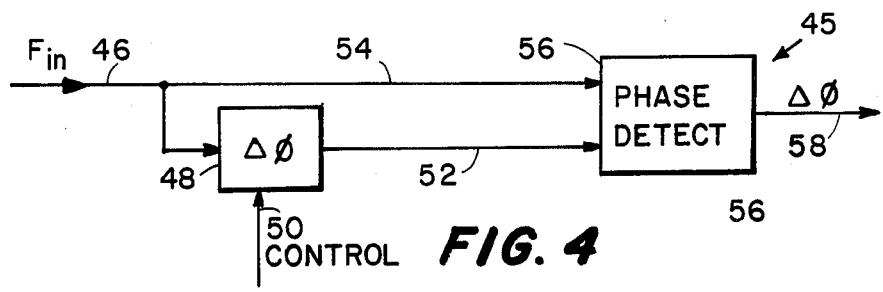
FIG. 4
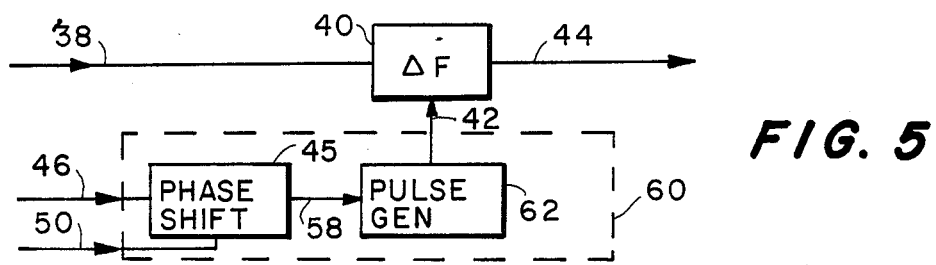
FIG. 5
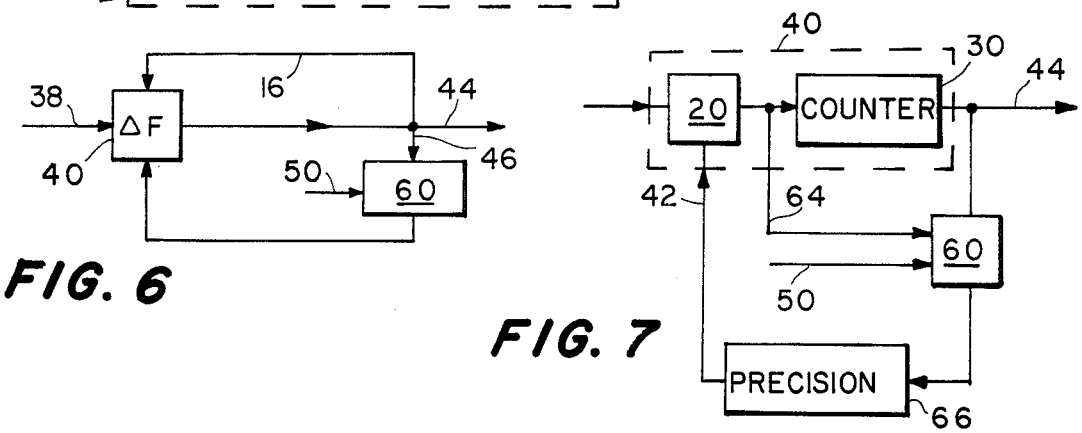
FIG. 6
FIG. 7
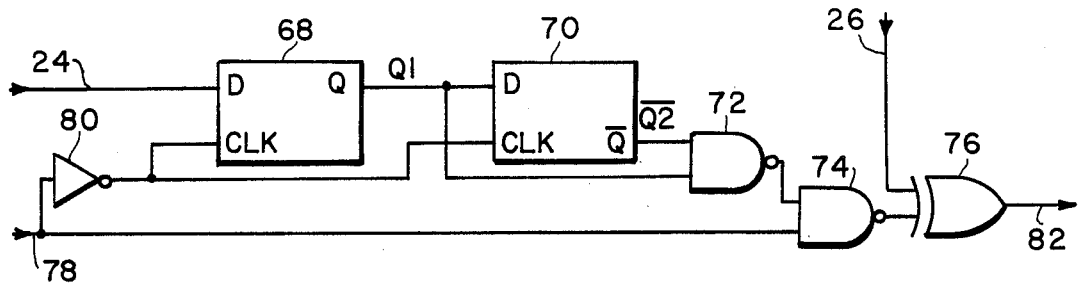
FIG. 8

VARIABLE DIGITAL FREQUENCY GENERATOR WITH VALUE STORAGE

BACKGROUND OF THE INVENTION

This invention relates to controllable generators of digital pulse sequences, and more specifically to controllable digital frequency generators.

In the prior art there are numerous digital circuits which operate on pulse sequences, and which may require specified controlled variation of various aspects of the sequences. One example of such a circuit is a digital phase locked loop, which receives as an input a pulse sequence of a particular frequency and which may controllaby vary the phase of the input sequence in order to conform to the phase of a different sequence. In another example, it may be required to provide a controllably variable frequency for a pulse sequence.

Prior art generators of variable frequency pulse sequences are known, as illustrated by Jamieson U.S. Pat. No. 3,651,414, Berney U.S. Pat. No. 4,007,408 and Ransom U.S. Pat. No. 3,096,483.

However, such prior art variable generators of pulse sequences having variable characteristics require complex circuitry, utilizing programmable counters, for example, and suffer from a further disadvantage in the lack of simple circuitry capable of storing the control signals in order repeatedly to provide the desired variation of a pulse characteristic.

The above reference to a simple storage capability relates, for example, to an ability of a digital frequency generating circuit to respond on a continuing basis to a one time control input. That is, to the ability of the circuit to respond to a single control pulse or to a single sequence of control pulses by permanently varying the frequency of the generated output pulse sequence, or by repeating a phase shifting operation for each successive cycle of the output pulse sequence. However, such a capability is required in digital circuits operating as second order phase locked loops.

A major disadvantage of the prior art is the necessity for storage circuits for storing control input sequences, or for storing predetermined conditions, in order to provide a continuing (or substantially constant) frequency for the generated pulse sequence in response to a single application of the control input. Whether such storage is provided in the form of actual numeric storage or in the form of storage of a divisor for a variable counter or divider used in the circuitry, the resulting circuits are complex and thus expensive to fabricate.

There is accordingly a need in the prior art for a pulse sequence generating circuit having a controllable frequency with simplified storage capabilities for information provided in a one time application of a control sequence.

SUMMARY AND OBJECTS OF THE INVENTION

It is accordingly a primary object of the present invention to overcome the difficulties of the prior art and to provide a simple, variable, digital frequency generator having storage for the control value thereof.

It is a more specific object of the invention to provide a variable digital frequency generator in which storage circuits are not required to maintain a constant frequency in response to application of a single input control sequence.

It is still a further object of the invention to provide a variable digital frequency generator utilizing temporal or phase storage of frequency control information.

It is another object of the invention to provide frequency control for a digital sequence generator utilizing a phase differential between two pulse sequences.

Yet another object of the invention is the provision of temporal storage for frequency control signals utilizing a controllable phase difference provided between a pair of pulse sequences wherein the pulse sequences are obtained in a feedback loop in the variable frequency generating circuit.

It is still a further object of the invention to provide a temporal storage of control information for a characteristic of a pulse sequence in a digital pulse sequence generator.

An additional object of the invention is the use of ripple counters in conjunction with pulse add/delete circuitry to provide phase shift circuitry for pulse sequences.

It is another object of the invention to use phase shift circuitry to effect frequency changes in a pulse sequence.

Still another object of the invention is the use of ripple counters together with pulse add/delete circuitry and a presettable counter to provide phase shift control to effect frequency changes in a pulse sequence.

In accordance with the foregoing and other objects of the invention, there is provided a variable pulse sequence generator including means for generating a pair of waveforms, and a phase adjusting means responsive to control signals to adjust the phase difference between the two waveforms. A sequence changing circuit is provided for changing a characteristic of the generated pulse sequence, such as frequency, in response to the phase difference between the two waveforms. The pulse sequence is modified by inserting or deleting a number of pulses therefrom, the number being chosen as a function of the phase difference between the waveforms.

More specifically, the phase adjusting means may also comprise means for inserting or deleting pulses into or from one or both of the two waveforms in response to the control signals applied thereto, thereby changing the phase difference between the waveforms. Responsive to these phase changes, the sequence changing circuit may periodically insert or delete pulses into or from an input pulse sequence in order to generate the desired output pulse sequence. Preferably, the two waveforms provided with the variable phase may themselves be derived from the input pulse sequence.

In accordance with another aspect of the invention there is provided a controllable digital variable frequency generator which receives an input pulse sequence of a first frequency and derives therefrom an output pulse sequence at an adjustable output frequency. Feedback control structure is provided for utilizing a portion of the output signal in order to modify the input signal, thereby to provide and maintain the desired output frequency in response to a particular frequency change control signal.

The frequency may be changed in noninteger increments, and the circuit may be operable by repeatedly adding or deleting pulses to or from the input pulse sequence in response to the control signal. The circuit operates by changing the effect of the feedback structure on the input signal in order to change the output frequency.

In yet another aspect of the invention the feedback structure utilizes a portion of the input sequence in order to provide the desired output frequency by modification of that input sequence and in order to maintain the output frequency thus obtained.

Modification of the input sequence is provided in a first direction by the feedback structure. Additionally the input sequence may be modified in a second direction by yet additional circuitry in the inventive structure. The sequence modifying circuitry may be controllable in order to provide the desired variable frequency control.

Advantageously, the inventive circuit may utilize simple ripple counters for repeatedly adding pulses to or deleting pulses from the input pulse sequence to provide the desired output pulse sequence.

Specific circuitry, utilizing a register and simple gating structure, may be provided for addition and deletion of pulses into various sequences developed in the circuit.

Add and delete modules may be provided for controllable variation of the output pulse sequence frequency. Control signals provided to the modules may thus result in the desired frequency variation in response to specified conditions. Alternatively, a presettable counter may be utilized having input control signals for determining the preset value thereof, and a further control signal to enable presetting of the counter.

Still other objects and features of the present invention will become more readily apparent to those skilled in the art from the following description wherein there is shown and described a preferred embodiment of the invention, simply by way of illustration of one of the best modes contemplated for carrying out the invention. As will be realized, the invention is capable of other, different, embodiments and its several details are capable of modification in various obvious aspects, all without departing from the invention. Accordingly, the drawing and description are provided for illustration and not for limitation of the invention.

BRIEF DESCRIPTION OF THE DRAWING

The foregoing and other features, objects and advantages of the present invention will be more readily appreciated upon reference to the following description of a preferred embodiment of the invention, when taken in conjunction with the accompanying drawing, in which:

FIG. 4 illustrates a fundamental principle of the present invention;

FIG. 5 shows an application of the principle of FIG. 4 to the circuit shown in FIG. 3;

FIG. 6 illustrates a feedback configuration embodying the principle of FIG. 5;

FIG. 7 shows a modification of the structure in FIG. 6 to include precision control, thereby to obtain the preferred embodiment of FIG. 1;

FIG. 8 shows a circuit utilized in the preferred embodiment for adding and deleting pulses to and from a pulse sequence.

DETAILED DESCRIPTION OF THE PREFERRED EMBODIMENT

Figure 1:
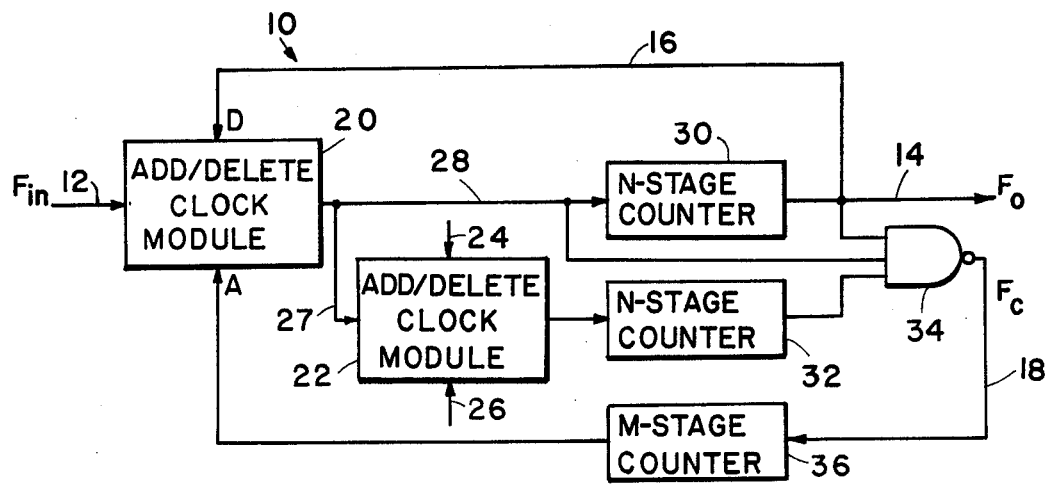
FIG. 1 shows a preferred embodiment of the present invention.

Referring now to FIG. 1, there is generally shown at 10 a preferred embodiment of the present invention. Therein, an input signal having a particular input frequency $F_{in}$ is provided on an input terminal 12. An output signal, having an output frequency $F_o$, is generated by the circuitry and is provided an output terminal 14.

A feedback structure is provided between output terminal 14 and input terminal 12, including first and second feedback paths 16 and 18. As shown in FIG. 1, first feedback path 16 provides a direct feedback of the output signal to an add/delete clock module 20 for modifying the input frequency by deletion of pulses therefrom as a function of the output frequency $F_o$.

The second feedback path provides pulses to the clock module 20 for modifying the input frequency in an opposite sense, by adding clock pulses thereto in a manner also dependent on the output frequency but controllable in accordance with a pair of control signals provided to a second add/delete clock module 22. The control signals, provided on input terminals 24 and 26, cause the second clock module 22 to delete or add clock pulses from or to the output of the first clock module 20 as input to module 22 on line 27.

As will be understood from the subsequent description of operation of the invention, the input frequency is varied by the inventive circuit to provide the output frequency by varying the mix of pulses deleted from and added to the input sequence by clock module 20. While the preferred embodiment illustrates a deletion of one pulse from the input signal for each output pulse, and an addition of a specified number of pulses as a function of the number of output pulses and as a function of the control signals provided to clock module 22, it is within the scope of the invention to control the number of pulses deleted from the input sequence by clock module 20 in addition to (or in place of) controlling the number of pulses added thereto as determined by clock module 22. Similarly, either feedback path 16 or 18, or both, may provide counters or dividers for varying the number of pulses deleted from or added to the input sequence by clock module 20. Thus, some portion of the output signal (which may be the entire signal) is fed back to vary the input signal, and particularly to modify the frequency of the input signal.

The pulse sequence generated by clock module 20 in response to the delete and add control signals provided thereto by feedback loops 16 and 18 is provided on output line 28 thereof. This pulse sequence is provided to a simple N-stage ripple counter 30 for generation of the output pulse sequence on the system output terminal 14. It is to be understood that although a simple binary ripple counter is provided, any counter, or any pulse divider, may be utilized. In fact, for a situation where N=0, the output pulse sequence may, in fact, be taken directly from clock module 20. A second N-stage ripple counter 32 is similarly provided, operating on the output of clock module 20.

The signal provided by the second feedback path 18 is obtained as a combination of the signals generated by the first and second ripple counters 30 and 32, together with the pulse sequence generated by clock module 20. The combination is generated by a NAND gate 34, although other combining circuits or logic gates may be used, as will be understood from the sequel.

Finally, an M-stage ripple counter 36 is provided in the feedback path 18 to control the precision with which the delete and add control signals provided on input terminals 24 and 26 affect the output frequency and to determine the symmetry of positive and negative variation of the output frequency about a selected "center" frequency.

Operation of the inventive circuit shown in FIG. 1 is described as follows.

A crystal clock (or other source) generates the input pulse stream provided on input terminal 12. As will be apparent from the subsequent description of the circuit of FIG. 7, the add/delete clock module 20 deletes one pulse from the input pulse stream for each pulse provided by the first feedback path 16. Since the feedback path in the embodiment of FIG. 1 connects the output signal directly to the delete terminal of module 20, it is apparent that the frequency of the signal on output line 28 of module 20 will be equal to the difference $F_n - F_o$. Thus, the input pulse sequence frequency is modified downwardly by the feedback path 16. The second feedback path 18 provides other pulses to the add terminal of module 20, thereby modifying the input frequency in the opposite, or increasing, direction. Accordingly, an appropriate balance between the pulses fed back on path 16, as opposed to those fed back on path 28, provides a desired frequency change for the pulse sequence on line 28.

If the input clock frequency is appropriately selected, the output frequency on output terminal 14 may be derived from the output of clock module 20 by a binary division provided by a simple N-stage ripple counter, as opposed to a decade divider or the like. However, it is noted that no matter which type of counter frequency divider is utilized, the inventive circuit eliminates the requirement of storage circuitry, such as a divisor for the output frequency of module 20 in order to provide the output frequency $F_0$ on output terminal 14.

Since counter 32 performs the same operation on its input signal as does counter 30 for its input, it is seen that, but for clock module 22, the outputs of the two counters will be substantially identical pulse signals, forming a division by $2^n$ of the output frequency of clock module 20.

The effect of module 22, which adds or deletes a number of pulses to or from the pulse sequence on line 27, is to delay or advance the signal output by counter 32 with respect to the output of counter 30. It should be appreciated that, in response to provision of a single control pulse on either of the two input terminals 24 or 26, the phase relationship between the outputs of counters 32 and 30 is essentially permanently modified by an amount dependent on N. For example, if the output of clock module 20 is at a frequency of 256 kHz, and if N=8, the output of both counters 30 and 32 will be at a 1 KhZ frequency. Further, insertion (or deletion) of 256 pulses by clock module 22 to the input of counter 32 will cause the output of that counter to shift in phase by 360° from the output of counter 30. Accordingly, each pulse added or deleted by module 22 results in a phase shift of approximately 1.4° between the outputs of the two counters.

Figure 2A:
FIGS. 2A-2D illustrate waveforms useful in understanding operation of the circuit of FIG. 1.
Figure 2B:
Figure 2C:

As seen by reference in FIGS. 2A–2D, there is seen at FIG. 2A a pulse sequence representing the output of module 20 provided on output line 28. The outputs of counters 30 and 32 are shown in the waveforms of FIGS. 2B and 2C, respectively. Operation of NAND gate 34 is such that the output signal thereof is at a steady value (logic one) if any of its inputs is low. Thus, during the portion of the cycles of the output signals of counters 30 and 32 in which the signals are in phase, i.e., during the 32 clock pulse portion in which both signals are at a high level, NAND gate 34 will be enabled and will provide an inverted form of the 256 kHz signal on its output line 18.

As is apparent from FIGS. 2A and 2C, addition of 96 clock pulses to the pulse stream on line 27 causes these pulses to be counted by counter 32. Since 256 pulses illustratively represent a full cycle (360°) in the output of counter 32, the addition of 96 pulses provides to the output of the counter a phase delay of 135° (the equivalent of 96/256 of 360° pulses).

To continue the numerical example, if clock module 22 is caused by signals on the 'add' input line 26 to provide an additional 96 cumulative pulses to the input of counter 32, the phase shift between the outputs of counters 30 and 32 will be 135°. That is, the output of counter 32 will lag the output of counter 30 by 135°. This phase difference continues until again changed by either deletion or addition of further pulses in accordance with input of further control signals on lines 24 and 26.

Figure 2D:
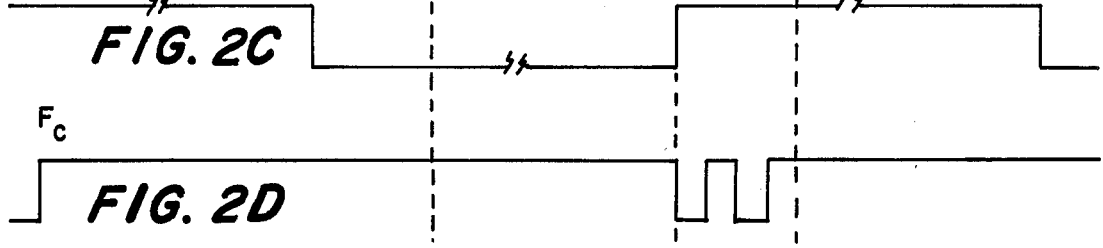

The output of gate 34 as provided in the second feedback path 18 is shown at FIG. 2D. More specifically, during the 45° of each cycle wherein the waveforms output by both counters 30 and 32 are at a high level the output of gate 34 will provide the inverted form of the pulse sequence on line 28. Thus, as seen in FIG. 2D, 32 pulses will be output by gate 34 for each cycle of the output signal on line 14. Without further adjustment, the repeated provision of 32 pulses to the add terminal of clock module 20 for each cycle of output frequency will result in the addition of 32 pulses for each one deleted pulse, or an overall variation of $F_{in}$ by addition of 31 pulses at the input to counter 30. Counter 36 is used to reduce the number of pulses provided by gate 34 to a value usable for finely counteracting the deletion of pulses provided by the first feedback path 16 and for selecting a center operating frequency as described in connection with FIG. 6.

As is seen from the foregoing, addition of further pulses by the provision of further signals on line 26, or deletion of pulses by provision of signals on line 24, results in changing the phase shift between the outputs of counters 30 and 32, thus changing the number of pulses output by gate 34 and by counter 36. As a consequence, a different number of pulses is added (or deleted) by clock module 20 to (or from) the input sequence on line 12 to provide the pulse signal on line 28. Variation of the frequency of the pulses on line 28 thus results in variation in the output frequency on line 14.

It is seen that the counters 30 and 32 affect the precision of control on the output frequency since each pulse added or deleted by clock module 22 results in a phase shift of $360°/2^n$, and thus permits a number of pulses to be passed by gate 34. The magnitude of the phase change provided by each add or delete pulse is thus determined by N. M-stage ripple counter 36, by dividing the number of pulses output by gate 34 by $2^m$, thus changes the number of pulses added to the input pulse stream in response to each add or delete pulse, thus also affecting the magnitude of the phase shift generated by each input control signal on line 24, 26. Additionally, a nominal phase shift may be chosen, by choice of the value of M, for which a nominal, or 'center' operating frequency is provided. This may be understood with reference to FIG. 2D and the understanding that frequency stability is attained for that phase shift which adds as many pulses by feedback path 18 as deleted by feedback path 16.

Thus, since on pulse is deleted by feedback path 16 for each cycle of the nominal output frequency, one pulse must be added by feedback path 18 at the nominal operating frequency. For the example of FIGS. 2A-2D there are nominally provided 32 output pulses on path 18. If M were chosen to be 5, then the 135° phase shift of FIGS. 2B and 2C would represent nominal operation since, of the 32 output pulses, only $32/2^5 = 1$ output pulse would be provided to the add input of module 20 for each cycle of operation. In such an arrangement, however, it is noted that the operating frequency may be increased by providing additional 'add' pulses, or by decreasing the phase shift between waveforms 2B and 2C. Thus, up to 92 control pulses may be provided on input line 24 to increase the operating frequency above the nominal frequency. However, only 32 control pulses may be provided on input line 26 to increase the phase shift between the two waveforms until a 180° shift is achieved. Thus, an asymmetric or, by appropriate choice of M, a symmetric, range of frequency variation may be provided by the present system.

To understand the selection of an appropriate value of M for providing a symmetric frequency variation about the nominal frequency, the operating characteristics of the inventive circuit should be recalled. First, a phase shift is provided between two waveforms. The phase shift is limited to the range 0°-180° since, for values between 180° and 360°, essentially the same numbers of pulses are generated by gate 34 as in the range 0°-180°. Thus, using the input to counter 30 as the clock signal to the middle input of gate 34 provides a resolution of $\frac{1}{2}(2^n) = 2^{n-1}$ pulses for the 180° of available phase shift. If it is desired that there be as much of an upward as a downward deviation from nominal, then $\frac{1}{2}(2^{n-1}) = 2^{n-2}$ pulses must be generated by gate 34 at the nominal frequency, so that the same number of pulses may be added thereto or subtracted therefrom to reach the limits (0 or $2^{n-1}$ pulses) of variability. Since at nominal frequency one pulse must be input to the add input of module 20 for each $2^{n-2}$ pulses on path 18 to balance the number of delete pulses provided by path 16, the M-stage ripple counter must divide $2^{n-2}/2^M$ to get 1, from whence it follows that $M = N - 2$.

Alternatively, it may be recognized that $2^N$ clock pulses represent a full 360° of the output cycle. Assuming the total range of frequency (or phase) variation encompasses 180°, then symmetry is obtained by selecting the nominal frequency (where the number of add pulses equals the number of delete pulses to module 20) to be at a phase shift of 90°—i.e., when $\frac{1}{4}(2^N) = 2^{N-2}$ clock pulses provided on path 18 per output cycle. It can thus be appreciated why, for symmetric operation, $M = N - 2 + K$ where K represents a K-stage ripple counter (not shown) which may be provided in feedback path 16. Where $K = 0$ (direct feedback on path 16), the relation reduces to the previously derived expression. It should also be recognized that where the clock input to gate 34 is not taken at the same frequency as input to both counters 30 and 32, but at some multiple thereof such as R, then $M = N - 2 + K + \log_2 R$. Where, however, it is desired to provide asymmetric control, e.g., with variation which is L times the range of the downward variation, then it can similarly be shown that $M = N - 1 + \log_2 L/(L+1) + \log_2 R + K$.

Figure 3:
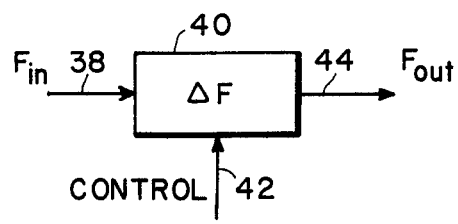
FIG. 3 illustrates an approach utilized in generation of variable frequency pulse sequences.

It should be apparent from the foregoing that, although feedback is used for simplicity in the embodiment of FIG. 1, the inventive concept may be utilized in other embodiments wherein a separate pulse source, difference from the output of clock module 20, may be used as the input to ripple counters 30 and 32, and further that, as mentioned above, the clock pulse input to gate 34 need not be the same signal as that input to counter 30. Thus, the basic concept of the invention as shown in FIG. 3 relates to the modification of an input pulse stream shown on line 38 by a digitally controlled oscillator (DCO) 40 for changing frequency in response to digital control signals on line 42 to provide an output pulse stream on line 44 having an output frequency different from the input frequency.

Such a desired approach is known in the art, but typically requires the control signal to be input repeatedly to the DCO 40 or, alternatively, requires storage circuitry to store the control signal. The inventive circuit, by utilizing temporal storage of control information, requires but a single occurrence of a control signal (or sequence) on line 42 to cause a permanent change between the input and output frequencies.

The temporal storage of control information as contemplated in the present invention is illustrated by a circuit 45 shown in FIG. 4, wherein an input pulse stream provided on line 46 is given a controllable a phase delay by phase changing circuit 48 in response to control signals on line 50. Preferably, the provision of a number of control pulses on line 50 will result in a phase shift between the two output signals on lines 52 and 54. This phase change is measured by phase detecting circuitry 56 which provides an output signal indicative of the detected phase change on output line 58 thereof. Where the phase changing circuit is a pulse addition and/or deletion module as previously described, a pair of counters may be used in lines 56, 54 to generate the phase shifted signals. The outputs of the counter may be combined as previously shown, and the phase difference therebetween may be detected by counting of a clock signal.

Since phase detecting circuit 56 is continuously operating and detects the phase shift for each cycle of operation, it is apparent that, for a single phase shifting operation in response to a single occurrence of signals on control line 50, the phase detecting circuit 56 will repeatedly provide output signals on its output line 58, for each cycle of the pulse sequence. Thus, by a one time application of signals on the control line 50 there is provided a continuing (or 'permanent') phase shift between the waveforms on the two lines 52 and 54. The phase shift at any time reflects the cumulative past history of signals on control line 50.

That is, without providing storage circuitry, the circuit of FIG. 4 uses time, or phase, relationships to "store" previous values of signals on line 50. Because of the time or phase storage of the control signal history, the cumulative effect of the control signal may then be provided repeatedly by the phase detecting circuit 56 to a circuit such as DCO 40 of FIG. 3.

FIG. 5 shows a configuration wherein the circuitry of FIG. 4 is, indeed, used to provide the control signals on line 42 for the DCO of FIG. 3. In FIG. 5 the circuitry of FIG. 4 is represented by the phase shift block 45 included within a control block 60. Also included in control block 60 is a pulse generator 62. The pulse generator essentially converts the phase shift information provided by block 45 to a form usable by the DCO, specifically to a sequence of pulses. It will be recalled that, in the embodiment of the invention shown in FIG. 1, the pulse generator receives a clock input signal and includes a gate 34 which passes to the frequency changing circuit a number of pulses determined by the phase shift produced by the phase shift circuit 45.

FIG. 5 thus symbolically represents the inventive approach in a general sense, wherein the input signals to the phase shift circuit 45 may be provided from any source, and need not be provided as feedback from the output of the frequency changing circuit 40. Further, pulse generator 62 similarly need not necessarily provide pulses generated internally of the frequency changing circuit 40. By comparison with FIG. 1, it is seen that the frequency change circuitry 40 may be provided as an add/delete clock module for adding or deleting pulses to or from an input pulse stream, along with the possible use of an N-stage ripple counter to divide the resultant frequency and thereby to provide variable control of the output frequency by steps which may be small fractions of a Hertz. The phase shift circuitry 45 may be realized by the use of a further add/delete clock module in conjunction with a pair of counters. Advantageously, one of the counters used in the phase shift circuitry may be identical to the counter provided in the frequency changing circuitry 40, thus simplifying fabrication of the device and reducing the parts count therefor. Moreover, while any type of counter may be used, it is preferred that simple ripple counters be utilized rather than the more complex and expensive synchronized or programmable counters. Additionally, the pulse generating circuit 62 is combined with the phase detecting circuit 56 in the simple structure of a gate 34, the circuit being further simplified by avoiding the use of an externally generated clock pulse source and utilizing instead a periodic signal occurring within the circuit, as found on line 28.

In order to provide increased stability and control of the output signal, the configuration of FIG. 5 is modified to provide the feedback loop 16 as shown in FIG. 6. Additionally, in order to utilize the existing circuitry of frequency change circuit 40, the control block 60 is similarly shown as receiving its input from the output line 44. This connection enables the dual purpose use of N-stage counter 30, both for determining the output frequency and for providing one of the two waveforms used to store the controlled phase shift. The feedback connection from line 44 further symbolizes the provision of the signals on line 28 as the clock pulses for gate 34 in the preferred embodiment of FIG. 1. The exact form of the preferred embodiment may be derived from FIG. 6 by the modifications shown in FIG. 7. Specifically, counter 30 is explicitly shown as forming a portion of frequency change circuit 40, along with the clock module 20. The output signal, along with clock pulses on clock line 64 derived from pulses present in frequency change circuit 40, are provided to the control block 60 together with the control signals present on line 50. The output of the control block 60 is fed back through a precision circuit symbolized by block 66 in order to control the step size of changes in the output circuitry in response to control signals on line 50, as previously described.

The present invention incorporates clock modules 20 and 22 for addition and deletion of pulses to and from a pulse stream. The particular circuit utilized in the modules 20 and 22 is shown in FIG. 8 and includes a pair of flip-flop stages 68 and 70, connected in a counter configuration, together with logic combining circuitry including first and second NAND gates 72 and 74 and EXCLUSIVE OR gate 76. As seen in the circuit, the Delete input to the module (shown on line 24 of module 22) is provided as the data input to the first flip-flop stage 68. A common clock input is provided at 78 to the two flip-flop stages, inverted by an inverter 80 to assure data clocking of stages 68 and 70 on the downward clock transitions. The ADD input to the module (shown on line 26 of module 22) is provided as one input to EXCLUSIVE OR gate 76, while the output of NAND gate 74 is provided at the other input to gate 76. The output of gate 76 is taken as the modified form of the clock input signals provided on line 78 after deletion or addition of appropriate numbers of pulses therefrom or thereto.

Operation of the circuit of FIG. 8 will be understood by reference to the timing diagrams shown in FIGS. 9A-9H as follows.

Figure 9:
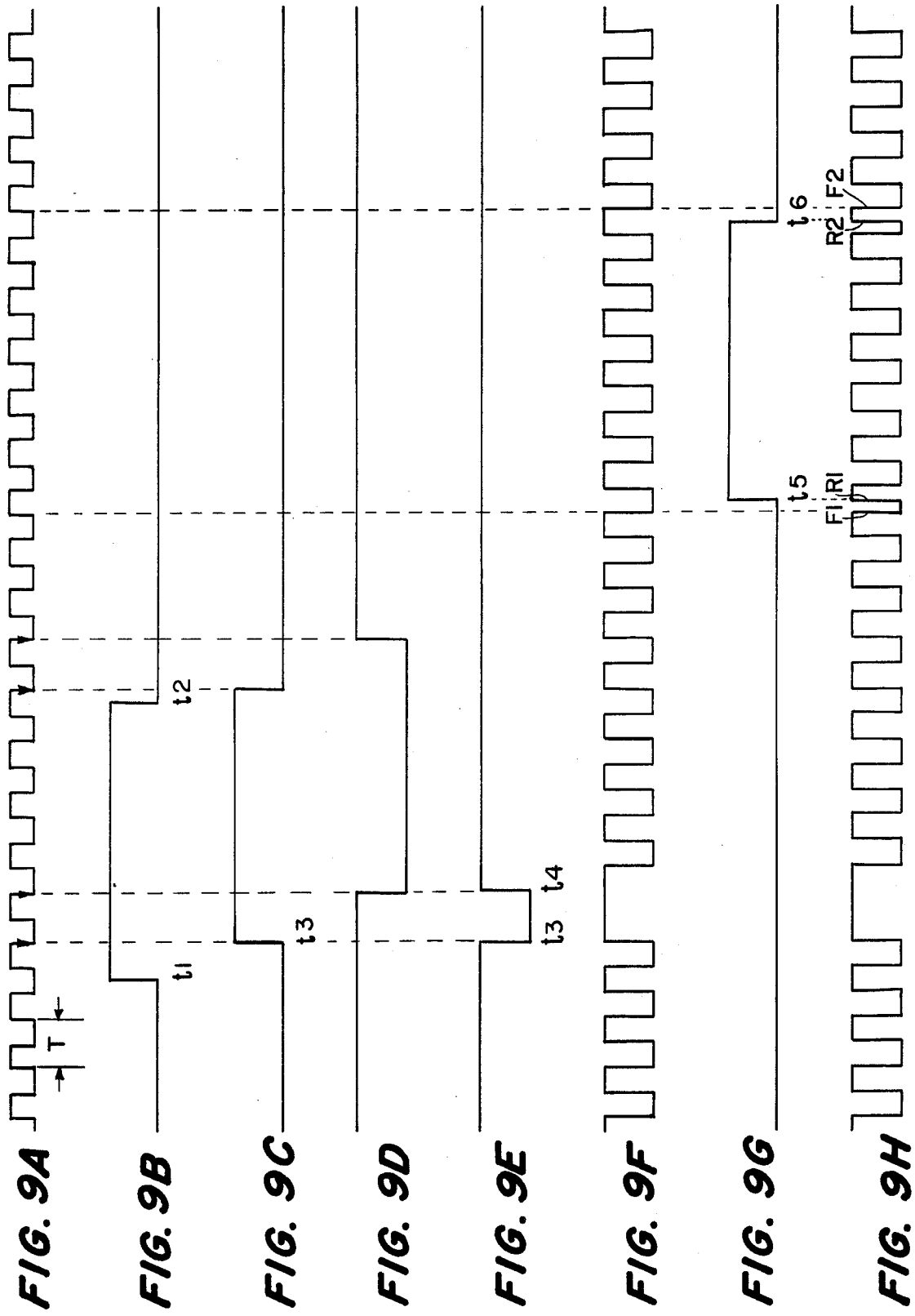
FIGS. 9A-9H show waveforms useful in understanding operation of FIG. 8.

Gate 72 is connected to gate 74 for one clock pulse duration in response to each positive transition of the delete input signal on line 24. The disabling of gate 74 thus results in an output sequence therefrom which contains one fewer clock pulses than on its input sequence. Accordingly, for a zero add input to EXCLUSIVE OR gate 76, the clock output signal provided on output line 82 of the module will have one fewer pulses than the input signal on line 78. This may be seen by reference to FIG. 9A, showing the clock pulses input on line 78 and having an illustrative period T. FIG. 9B shows an illustrative signal provided on the delete input line 24, wherein at some arbitrary time t1 the input rises in voltage level and at some subsequent arbitrary time t2 the input drops back to its low level. The Q output of flip-flop stage 68 is shown as Q1 in FIG. 9C. Inversion of the clock input signal is provided by an inverter 80 so that both flip-flops 68 and 70 change state on the high-to-low transitions of the clock signal. The resultant phase inversion of changes in the flip-flop outputs with respect to changes provided at the clock input of gate 74 eliminates a possible race condition in which output glitches may be provided by gate 2. Such glitches may be counted as pulses by the succeeding circuits, thus undoing the effect of the delete signal. Inverter 80 thus advantageously eliminates one possible source of error. Of course, the inverter may be provided at the input to gate 74 while the rising segments of the clock signal on line 78 may be provided to the flip-flop stages 68 and 70.

The output signal Q1 from flip-flop stage 78, shown in FIG. 9C, is input to the data terminal of flip-flop stage 70 together with the inverted form of the clock signal. Accordingly, one clock cycle after the change in output Q1, the inverted output of flip-flop stage 70, Q2 as shown in FIG. 9D drops from the high to low value thereof. Gate 72 receives high level inputs on both terminals only during the clock period beginnng at time t3, that is, beginning with the upward transition in Q1. Accordingly, the output of gate 72 is high except for one clock period beginning at time t3 as shown at FIG. 9E. Gate 74, which thus receives a high input from gate 72 at all times except for one clock pulse period beginning at time t3, thus outputs an inverted form of the clock input signal on line 78 at all times except for the time period beginning at t3. Since, by inversion of the clock input signal, the time period of interest begins on downward changes in the clock signal, any propagation delay provided in the signal generated by gate 72 is harmless. Without such an inversion, the one cycle signal generated by gate 72 would begin at a time coincident with a rising edge of the clock signal, and any propagation delay might result in a negative pulse being erroneously generated. Further, at time t4 the output signal of gate 72 once again rises.

The present circuit utilizes propagation delay in the rising edge of the signal output by gate 72 at time t4 to avoid any possible glitches at the transition, since the rising edge of the output signal will in fact occur subsequently to the falling edge of the clock signal. Accordingly, the output of gate 74, which rose at time t3 and remained high up to time t4, continues to remain high at time t4 until the next subsequent rising edge of the clock signal. Since propagation delay causes the output of gate 72 to rise somewhat after the corresponding downward clock transition, the continuing high output level of gate 74 is assured.

It is thus seen that the output of gate 74 introduces a 360° phase shift in response to the rising edge of the delete input on line 24. That is, two transitions in the clock pulse signal, or one full clock pulse, are deleted from the output of gate 74 in response to the rising edge on the delete input signal. As will be seen by reference to FIGS. 9B, 9C and 9D, no further high level coincidence of the output of flip-flop stage 68 and the inverted output of flip-flop stage 70 will occur through the duration of the delete input pulse and thereafter, until a subsequent rising edge is provided on input line 24. Finally, the output of EXCLUSIVE OR gate 76, assuming the add input on line 26 is at a low level, follows the output of gate 74, as shown in FIG. 9H, and similarly deletes one pulse from the input clock sequence for each rising transition on the delete input line.

It is noted that for the rising transition of the delete input to be detected by the present circuit, the high level on the delete input line must be present during at least one downward transition of the clock signal on line 78. To assure that the delete input is detected, it is accordingly preferable to provide delete input pulses which are at least one clock cycle in duration. In that event, the present circuit advantageously eliminates any need to synchronize the delete pulses with the clock signal or with operation of any other component of the circuit.

Finally, upon the occurrence of an add input pulse on line 26 at time t5, as shown at FIG. 9G, the phase of the output of the circuit will change by 180°. In other words, upon the occurrence of a rising edge of an add input pulse the output pulses provided by gate 76 will become 180° out of phase with the pulses generated by gate 74. This is seen in FIG. 9H during the interval t5-t6, the duration of the input add pulse on line 26. An additional phase reversal is provided at time t6, at which point the output of EXCLUSIVE OR gate 76 will once again be in phase with the output of gate 74. Thus, at time t5 EXCLUSIVE OR gate 76 adds one transition to the output pulse sequence provided thereby, and a second transition is added at time t6, upon termination of the add pulse on input line 26. The combined effect of the rising and falling edges of the add input pulse is thus the addition of two transitions, or one pulse, to the pulse train output by gate 74.

Since the transitions may be added at any time a rising or falling edge of the add input pulse is provided, the addition of pulses may be provided independently of a simultaneous application of a delete pulse signal. It is noted, however, that unlike the delete input signal, which causes the deletion of a full pulse in reponse to the rising edge of the control signal, both transitions of the add pulse must occur prior to the addition of a full pulse to the output sequence. It is also noted that, although the full 360° phase shift will be provided by an add pulse independently of its synchronization with the clock signal, it is preferable to provide the rising and falling edges of the add pulse at some minimum distance from the transitions of the output of gate 74 in order to assure that the transitions added thereby are detectable.

That is, as seen from FIG. 9H the transition at t5 may result in a short duration between the falling and rising edges F1 and R1 provided by the gate 76. The closer time t5 occurs to a transition in the output of gate 74 the shorter the separation between the falling and rising times F1 and R1. Similar considerations are seen to apply with respect to the falling transition of the add pulse in FIG. 9G, shown at time t6. The result of this transition is a similar transition provided in the waveform of FIG. 9H, having a rising edge R2 and a falling edge F2.

In order to assure the detectability of the added transitions, the add control pulse is preferably provided at some time intermediate to clock transitions, and preferably at a 90° phase shift with respect to the clock signal. Thus, the transitions introduced into the output waveform shown in FIG. 9H will provide the widest, hence most easily detected, additional pulses. Such phase shift may be provided by using a clocked register, clocked by a 90° phase shifted clock signal, to provide the add signals.

It should be understood that the add/delete clock module shown in FIG. 8 may be modified in a number of ways. For example, replacement of gate 72 by an EXCLUSIVE OR gate will result in the deletion of two clock pulses per delete pulse, since a pulse will be deleted both on the rising and falling transitions of the delete pulse. Further, a number of delete inputs may be provided as inputs to an EXCLUSIVE OR gate (not shown) whose output is connected to delete input line 24. For occurrences of a plurality of delete control pulses on the several inputs to the EXCLUSIVE OR gate there will be provided a plurality of rising edges at the input to flip-flop stage 68, thus deleting a plurality of pulses. Similarly, the number of inputs to EXCLUSIVE OR gate 76 may be increased to provide addition of a number of pulses to a pulse stream in response to control signals provided from a plurality of sources.

Having described the operation of the structure in FIGS. 1 and 8, the following numerical examples illustrate the frequency modification provided thereby.

Since each of the ripple counters used in the inventive circuit operates as a divider circuit for a power of two, the basic equation describing the output frequency, $F_o$, is:

$$F_o = [F_{in} + (F_c/2_m) - F_o]/2^n$$

Therefore:

$$F_o = [2^m \cdot F_{in} + F_c]/2^m(2^{n+1})$$

Since the output of gate 34, having the frequency $F_c$, represents a number of clock pulses from line 28 passing through a period of coincidence between the outputs of ripple counters 30 and 32, and since, for any phase difference therebetween such coincidence will occur at the output frequency $F_o$, then the frequency $F_c$ is seen to be some multiple of $F_o$. That is, $$F_c = C \cdot F_o$$

Further, because the same input signal is used as a clock signal for gate 34 and as the signal being divided by the two counters 30 and 32, it is seen that the addition or deletion of each pulse by clock module 22 will result in the provision of a single output pulse from gate 34 during each period of the output frequency $F_o$. In other words, the constant C provided in the preceding equation represents the number of pulses input to clock module 22.

As has previously been described, the number C, which thus represents the count difference between counters 30 and 32, covers a range from 0 to $2^{n-1}$. Combining the two previous equations to eliminate $F_c$ results in:

$$F_o = (2^m \cdot F_{in})/[2^m + 1) - C]$$

The effective gain between $F_o$ and the variable C is given by:

$$dF_o/dC = (2^m \cdot F_{in})/[4^m(2^n+1)^2 - 2^{m+1}(2^n+1)C - C^2]$$

The nonlinearity inherent in Equation 2 between $F_o$ and C is negligible due to the very small percentage change in $F_o$ over the range of C. A typical case having $N=8$, $M=6$ and C ranging from 0 to 128 yields a nonlinearity of less than 0.2%, while the $F_o$ control range is $+/-0.4\%$.

The present invention may be used with a phase detector to provide a phase lock loop. Such a phase lock loop may, for example, be used in reference carrier recovery in a modem. The foregoing exemplary figures are adequate for such applications since the loop dynamic response is not materially degraded by nonlinearities up to 5%. Other applications may use this method for frequency control up to approximately 10%.

Since the present invention provides storage, equivalent to integration, the circuit may be utilized in second order phase lock loops without the necessity for storage, integrating, or programmable counting devices.

A variation of the basic system of FIG. 1 allows first order phase control inputs to be applied, independent of the C factor controls. This is done by modifying the add/delete module, supplying clock to both N-stage counters, to include a second independent pair of add/delete control inputs. Both N-stage counters respond to these controls in identical fashion, causing direct phase increment/decrement steps to appear at $F_o$ while not altering the count difference between counters; i.e., the C factor is not altered. Synchronous timing of control inputs insures independence between first and second order effects at $F_o$ when applied in a phase lock loop system.

Figure 10:
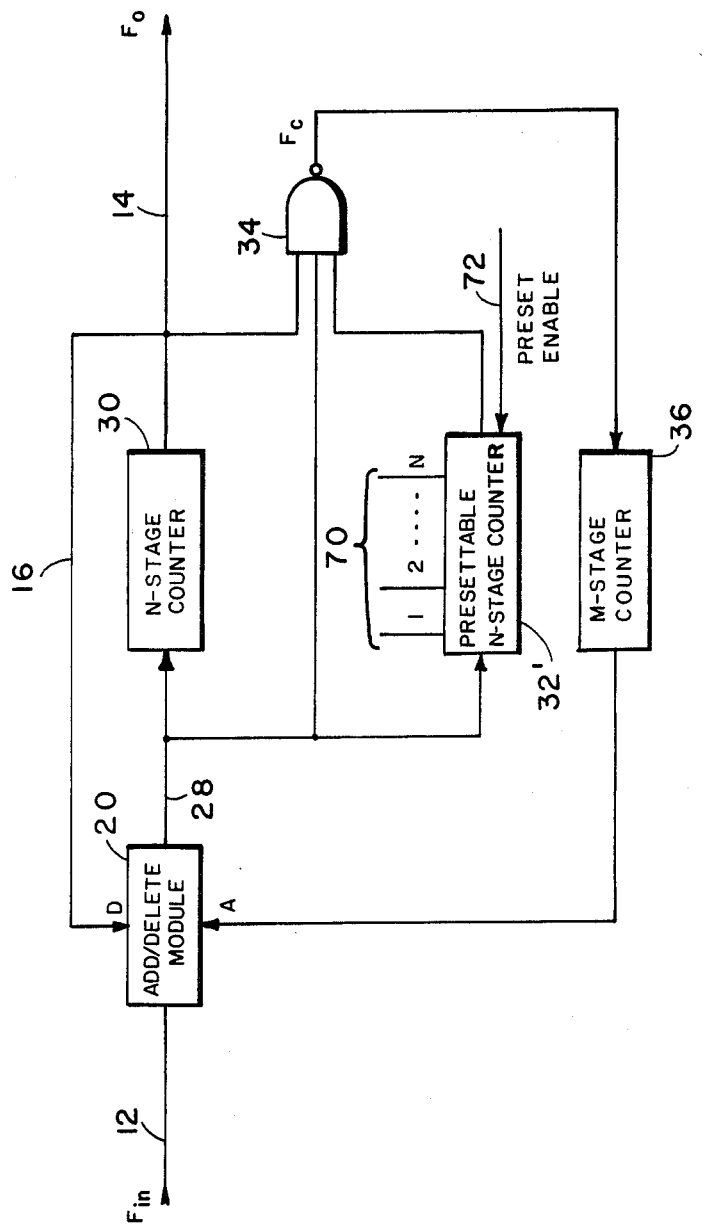
FIG. 10 shows an alternate embodiment of the structure in FIG. 1.

In an alternate embodiment of the invention, temporal storage of control signal history may be provided by the use of a presettable counter, rather than by an add/delete module. Referring specifically to FIG. 10, components utilized in the embodiment of FIG. 1 are identified by the same reference numerals. Thus, add/delete module 20, N-stage counter 30, NAND gate 34 and M-stage counter 36 are provided.

However, the add/delete module 22 is eliminated and N-stage counter 32 is replaced by an N-stage presettable counter 32'. Counter 32' is provided with a capability of being preset to a specific count value, prescribed by an N bit word provided on parallel preset input lines 70. A preset enable control signal is provided on line 72 for enabling counter 32' to be preset to the count represented by the signals on lines 70. The control signal on line 72 may be synchronized with or clocked by the output signal on output line 14.

The circuit of FIG. 10 shows the possibility of using parallel control signals, rather than series control signals, for variation of the output frequency. The structure retains the basic advantages of the embodiment of FIG. 1, specifically permitting the nonintegral variation of frequency, over a predetermined range and at a desired resolution, so that a fine control may be provided for the output frequency. It should be appreciated, of course, that serial presetting signals may be provided to counter 32'.

The concepts used in the structure of FIG. 1 are similarly utilized in FIG. 10, in that a nominal count may be input to counter 32' for operation at a desired frequency. Increasing the input count results in advancing the phase of the signal output by counter 32' with respect to the signal output by counter 30, thus providing additional add pulses to add/delete module 20, and increasing the output frequency $F_0$. Similarly, reducing the preset count leads to phase retardation of the output of counter 32', thus reducing the number of add pulses supplied to module 20 and lowering the output frequency. This operation is similar to that of FIG. 1, as previously described.

The foregoing specification has provided a description of a circuit for controllably affecting a characteristic of a pulse sequence, and for specifically affecting the frequency of the sequence in a simplified manner requiring a reduced number of parts. The inventive circuit utilizes temporal storage of phase shift information, thus eliminating the need for storage circuits or for programmable dividers. Advantageously, the circuit establishes a nominal operating frequency and provides variation of that frequency over a particular range to any desired degree of precision.

The foregoing description of the preferred embodiment of the invention has been presented for purposes of illustration and description, and is not intended to be exhaustive or to limit the invention to the precise forms disclosed, since many obvious modifications and variations are possible in light of the above teaching. The embodiment was chosen and described in order best to explain the principles of the invention and its practical application, thereby to enable others skilled in the art best to utilize the invention in various embodiments and with various modifications as are suited to the particular use contemplated. It is intended that the scope of the invention be defined by the claims appended hereto, when interpreted in accordance with the full breadth to which they are fairly and legally entitled.

What is claimed is:

1. A controllable digital variable frequency generator having an input signal at a first frequency and deriving therefrom an output signal at an adjustable output frequency comprising:

feedback means for utilizing a portion of said input signal to modify the input signal to provide the desired output frequency and to maintain the output frequency thus obtained; and change means responsive to change signals for modifying the input signal comprising connecting means for periodically deleting a pulse from said input signal responsive to said first change signal;

said feedback means comprising first means, including first N-stage ripple counter means for providing to said change means a first change signal representing a number of changes in a modified form of said input signal, thereby providing a first modification of said input signal; and comprising second means including presettable counter means receiving said modified form of said input signal and having an output for providing a second change signal to said change means for adding a pulse to said input signal, said change means operable for adding a pulse to said input signal responsive to said second signal;

said presettable counter means receiving signals representative of a preset count for adjusting the number of second change signals provided thereby for adding a pulse to said input signal.

2. A controllable digital variable frequency generator having an input signal at a first frequency and deriving therefrom an output signal at an adjustable output frequency comprising:

feedback means for utilizing a portion of said input signal to modify the input signal to provide the desired output frequency and to maintain the output frequency thus obtained; and change means responsive to change signals for modifying the input signal comprising connecting means for periodically deleting a pulse from said input signal responsive to said first change signal;

said feedback means comprising first means, including first N-stage ripple counter means for providing to said change means a first change signal representing a number of changes in a modified form of said input signal, thereby providing a first modification of said input signal, and said feedback means comprising second means including second ripple counter means receiving said modified form of said input signal and having an output for providing a second change signal to said change means for adding a pulse to said input signal, said change means operable for adding a pulse to said input signal responsive to said second signal; and said second means comprising adjusting means responsive to adjusting signals for adjusting the number of second change signals provided thereby for adding a pulse to said input signal.

3. A controllable digital variable frequency generator as claimed in claim 2 wherein said second ripple counter means comprises an N-stage ripple counter.

4. A controllable digital variable frequency generator as claimed in claim 2 wherein said second means further comprises combining means for combining said output of said second ripple counter means and said output signal in a combined signal, and third means comprising M-stage ripple counter means receiving said combined signal for generating said second change signal for adjustably adding pulses to said input signal.

5. A controllable digital variable frequency generator as claimed in claim 4 wherein said combining means is connected for combining said output of said second ripple counter means and said output signal with the modified form of said input signal.

6. A controllable digital variable frequency generator as claimed in claim 5 wherein said combining means comprises NAND gate means.

7. A controllable digital variable frequency generator having an input signal at a first frequency and deriving therefrom an output signal at an adjustable output frequency comprising:

feedback means for utilizing a portion of said input signal to modify the input signal to provide the desired output frequency and to maintain the output frequency thus obtained;

change means responsive to change signals for modifying the input signal;

said feedback means comprising first means, including first N-stage ripple counter means for providing to said change means a first change signal representing a number of changes in a modified form of said input signal, thereby providing a first modification of said input signal; and said feedback means further comprising output feedback means for utilizing a portion of said output signal to provide a further change signal to said change means further to modify the input signal.

8. A controllable digital variable frequency generator as claimed in claim 7 wherein said output feedback means comprises M-stage ripple counter means receiving said output signal and for providing said further change signal to said change means to modify the input signal in a second modification opposing said first modification.

9. A controllable digital variable frequency generator as claimed in claim 2 wherein said adjusting means comprises second change means responsive to external signals for adding pulses to or deleting pulses from the pulses input to said second ripple counter means, whereby said input signal is modified by periodically deleting pulses therefrom and variably adding pulses thereto, and whereby said output signal is obtained as an output of said first ripple counter means count of pulses in the modified form of said input signal.

10. A controllable digital variable frequency generator having an input signal at a first frequency and deriving therefrom an adjustable output signal at an output frequency comprising:

feedback means for utilizing a portion of the output signal to modify the input signal to provide the desired output frequency and for maintaining the desired output frequency;

change means responsive to first and second change signals for changeably deriving the output frequency from the input frequency and for changing the effect of the feedback means on the input signal, thereby to change the output frequency in response to said change signals;

said change means including means for selectively deleting pulses from or adding pulses to said input signal responsive to said first and second change signals, respectively, and said change means further comprising:

first and second input means for said first and second change signals, respectively, and third input means for said input signal;

multistage register means responsive to said input signal, a first stage thereof including said first change signal through said first input means;

first combining means for combining an output of said first stage and an output of a subsequent stage of said register;

second combining means for combining an output of said first combining means with said input signal; and third combining means for combining an output of said second combining means with said second change signal to provide an output representing a modified form of said input signal having pulses deleted therefrom in accordance with occurrences of said first signal and pulses added thereto in accordance with occurrences of said second signal.

11. A multistage register means as recited in claim 10 wherein said multistage register means comprises first and second stages, said first stage receiving said input signal and said first change signal and providing a first output, said second stage receiving said input signal and said first output of said first stage and having and inverted output, said first combining means operable for combining said first output of said first stage and said inverted output of said second stage and for producing an inverted pulse in response to a transition of said first change signal, said second combining means operable for combining said inverted pulse with said input signal and for deleting a pair of transitions from said input signal responsive thereto.

12. A multistage register means as recited in claim 11 wherein said third combining means is operable for combining said second change signal with said input signal and for adding a transition to said input signal in response to each transition of said second change signal, whereby a pulse having two transitions is added to said input signal in response to a pulse of said second change signal.

13. A multistage register means as recited in claim 12 wherein said third combining means comprises EXCLUSIVE OR gate means.

14. A multistage register means as recited in claim 13 wherein said first and second combining means each comprises NAND gate means.

* * * * *